US 7,759,768 B2

(12) United States Patent
Barth et al.

(10) Patent No.: US 7,759,768 B2
(45) Date of Patent: Jul. 20, 2010

(54) INTEGRATED CIRCUIT WITH INTERGRATED CAPACITOR AND METHODS FOR MAKING SAME

(75) Inventors: Hans-Joachim Barth, Munich (DE); Juergen Holz, Munich (DE)

(73) Assignee: Infineon Technologies AG, Munich (DE)

( * ) Notice: Subject to any disclaimer, the term of this patent is extended or adjusted under 35 U.S.C. 154(b) by 556 days.

(21) Appl. No.: 10/513,057

(22) PCT Filed: Mar. 17, 2003

(86) PCT No.: PCT/DE03/00862

§ 371 (c)(1),
(2), (4) Date: Jun. 2, 2005

(87) PCT Pub. No.: WO03/094233

PCT Pub. Date: Nov. 13, 2003

(65) Prior Publication Data

US 2005/0224908 A1    Oct. 13, 2005

(30) Foreign Application Priority Data

Apr. 29, 2002    (DE)    ............................. 102 19 116

(51) Int. Cl.
*H01L 23/52* (2006.01)
(52) U.S. Cl. ................ 257/532; 257/528; 257/E27.025
(58) Field of Classification Search ................ 257/528, 257/532, 516, 758, 759, 774, 776, E27.025, 257/E27.026, E27.031, E27.032, E23.011, 257/E23.012, E23.141
See application file for complete search history.

(56) References Cited

U.S. PATENT DOCUMENTS

| 5,185,650 | A | | 2/1993 | Wakimoto et al. |
| 5,565,707 | A | * | 10/1996 | Colgan et al. ............... 257/762 |
| 6,064,108 | A | | 5/2000 | Martinez |
| 6,162,686 | A | | 12/2000 | Huang et al. ................. 438/281 |
| 6,340,832 | B2 | * | 1/2002 | Kasahara ..................... 257/532 |
| 6,727,590 | B2 | * | 4/2004 | Izumitani et al. ............. 257/758 |
| 6,740,974 | B2 | * | 5/2004 | Yoshitomi .................... 257/751 |
| 2001/0013660 | A1 | * | 8/2001 | Duncombe et al. .......... 257/760 |
| 2002/0017730 | A1 | * | 2/2002 | Tahara et al. ................. 257/786 |
| 2002/0037643 | A1 | | 3/2002 | Ishimaru ..................... 438/642 |
| 2002/0066919 | A1 | | 6/2002 | Duncombe et al. .......... 257/306 |

(Continued)

FOREIGN PATENT DOCUMENTS

DE    691 18 771 T 2    7/1991

(Continued)

OTHER PUBLICATIONS

PCT Search Report dated Aug. 28, 2003 for PCT/DE 03/00862.

(Continued)

*Primary Examiner*—Zandra Smith
*Assistant Examiner*—Paul E Patton
(74) *Attorney, Agent, or Firm*—Brinks Hofer Gilson & Lione (57) ABSTRACT

An explanation is given of, inter alia, a circuit arrangement in which an intermediate layer (160) made of a dielectric material is arranged between two metal layers (102 and 104). The intermediate layer (160) is designed in such a way that the capacitance per unit area between the connection layers (102, 104) is greater than 0.5 fF/$\mu$m$^2$.

43 Claims, 4 Drawing Sheets

U.S. PATENT DOCUMENTS

| | | | |
|---|---|---|---|
| 2003/0045082 A1* | 3/2003 | Eldridge et al. | 438/593 |
| 2003/0160324 A1* | 8/2003 | Dragon et al. | 257/758 |
| 2004/0094836 A1* | 5/2004 | Seshan et al. | 257/735 |
| 2005/0221539 A1* | 10/2005 | Kim et al. | 438/132 |

FOREIGN PATENT DOCUMENTS

| | | |
|---|---|---|
| DE | 691 23 295 T 2 | 7/1991 |
| DE | 199 45 820 A1 | 9/1999 |
| EP | 1 182 703 A2 | 2/2002 |
| JP | 360941 | 6/1998 |
| JP | 2002-057291 | 2/2002 |
| JP | 2002-057292 | 2/2002 |
| WO | WO 98/49722 | 11/1998 |

OTHER PUBLICATIONS

English translation of the Pre-Action Notification of Examination (issued to German patent application No. 092105723).

English translation of Office Action issued in counterpart Japanese application 2004-502353, dated Feb. 28, 2008, 6 pages.

* cited by examiner

INTEGRATED CIRCUIT WITH INTERGRATED CAPACITOR AND METHODS FOR MAKING SAME

This application claims the priority of International Patent Application PCT/DE03/00862 filed on Mar. 17, 2003, which claims priority to German Patent Application 102 19 116.6 filed on Apr. 29, 2002 and is incorporated herein by reference.

The invention relates to an integrated circuit arrangement containing a multiplicity of integrated components in a semiconductor substrate. In addition, the integrated circuit arrangement contains two mutually adjacent connection layers, which each contain a multiplicity of electrically conductive connection sections which form parts of electrically conductive connections to the components. An intermediate layer is arranged between the two connection layers.

The integrated components are, for example, MOS transistors (Metal Oxide Semiconductor) or bipolar transistors, i.e. typical semiconductor components. The semiconductor components are arranged in a substrate composed, for example, of silicon.

The connection layers are also referred to as metallization layers because they are usually produced from a metal, for example from aluminium or from copper. In this context, a term that is also used is metallization planes, e.g. metal 1 and metal 2. Each connection layer is produced in a separate deposition process and lies in a plane parallel to the other connection layers.

The intermediate layer is usually formed by a barrier layer, e.g. made of silicon nitride, having a small thickness in comparison with the entire intermediate layer, and from a comparatively thick layer having a small dielectric constant k. The intermediate layer between the connection layers is usually made comparatively thick, for example 500 nm. These measures are intended to ensure that the capacitive coupling between the connection layers is as small as possible.

It is an object of the invention to specify an integrated circuit arrangement of simple construction which, in particular, has improved electronic properties in comparison with the known circuit arrangement. Moreover, the intention is to specify associated production methods.

In the circuit arrangement according to the invention, the intermediate layer is designed, e.g. on account of its thickness and/or its dielectric constant, in such a way that a capacitance per unit area of greater than 0.5 fF/$\mu m^2$ (femtofarad per micrometer squared) is produced between the two connection layers. The capacitance per unit area is preferably greater than 0.7 fF/$\mu m^2$ and reaches a value of about 2.0 fF/$\mu m^2$ in one refinement. The circuit arrangement according to the invention affords numerous advantages. Thus, capacitors with a linear transfer function can be arranged in a simple manner within the connection layers without any additional masks. So-called blocking or backup capacitors for suppressing short voltage spikes can be produced in a simple manner between connecting lines for carrying the operating voltage. Furthermore, the production of contacts between connection layers is simplified because the intermediate layer has a reduced thickness. These advantages will be explained in more detail below with reference to the refinements.

In one development of the circuit arrangement according to the invention, the circuit arrangement contains a passivation layer for protection against ambient influences. The passivation layer contains at least one cut-out, which leads to a connection section of a connection layer. This connection section forms a terminal for connecting an external electrically conductive connection. If the external electrically conductive connection is a bonding wire, then the terminal is also referred to as a bonding pad. However, the terminal can also be utilized for the so-called fast chip mounting technique (flip-chip technique). If the connection sections are composed of aluminium or an aluminium alloy, then previously proven technologies can be utilized for connecting external connections without, for example, having to develop new bonding techniques.

In a next development of a circuit arrangement according to the invention, the circuit arrangement likewise contains a passivation layer for protection against ambient influences. The passivation layer contains at least one cut-out, which leads to a connection section. This connection section connects two components and can or was able to be interrupted with the aid of a laser beam in order thus to select one of at least two circuit variants. Such connection sections are also referred to as fusible links or fuse connections or as fuses.

The cut-outs for the terminal areas and for the fuse connections can be produced simultaneously. Since the intermediate layer in the circuit arrangement according to the invention can be made very thin in comparison with conventional intermediate layers, it is possible to simplify the patterning and filling of contact openings in the region of the terminals or in the region of the fuse connection with aluminium or another material. The so-called aspect ratio is more favourable than in the case of the thicker intermediate layers customary heretofore. Thus, the aspect ratio is e.g. 0.2 if the intermediate layer is about 100 nm thick and the contact hole has a diameter of 0.5 micrometre. Moreover, in the case of aluminium connection layers, for example, there is no need for relatively high-impedance tungsten fillings for the contact holes.

In a next development of the method according to the invention, at least one connection section in one connection layer and at least one connection section in the other connection layer serves for carrying a fixed operating voltage. The connection sections for carrying the operating voltages overlap in a region whose capacitance per unit area forms a capacitor which effectively suppresses short interference pulses. Such a capacitor is also referred to as a blocking capacitor or backup capacitor. In one refinement, the connection sections for carrying the operating voltages are situated in a digital circuit section of the circuit arrangement. It is precisely in the digital circuit section that the short interference pulses are generated by switching processes. The blocking capacitors are necessary in order to prevent damage to the components and circuits. In the region of the blocking capacitors, the operating voltage lines are embodied on a considerably larger area than would actually be necessary for conducting the respective current. Thus, this area is for example 5, 10 or even a hundred times larger than necessary for conducting current. On account of these large areas, it is possible to generate capacitances for example in the range from one nanofarad to 10 nanofarads.

The additional area requirement for the blocking capacitors nevertheless remains comparatively small because the blocking capacitors simultaneously serve for feeding the operating voltage. Moreover, the blocking capacitors do not have to be produced in a different way, for example by means of MOS capacitors requiring an additional active gate oxide area. In other words, the active gate oxide area is not enlarged overall, as would be the case if producing the blocking capacitors as MOS capacitors. For circuits with a significant proportion of blocking capacitances, this leads to a yield and reliability advantage.

By distributing the blocking capacitors along the operating voltage lines, it is possible, given a suitable layout; to avoid a production of LC resonant circuits having a high quality factor. The operating voltage lines cover the respective plane as far as possible over the whole area, i.e. to a proportion of greater than 90% or even greater than 95%. In order to avoid parasitic resonant circuits, the operating voltage lines are configured for example as a network in order to produce a multiplicity of parasitic resonant circuits that differ from one another and to achieve damping of the resonant circuits. The damping can be increased in a targeted manner by interconnect sections having a small width or by slots transversely with respect to the current flow direction.

In a next refinement of the integrated circuit arrangement, the two connection layers contain the electrodes of at least one capacitor, a part of the intermediate layer forming the dielectric of the capacitor. A so-called MIM capacitor (Metal Isolator Metal) is produced in this way. These capacitors are capacitors with a linear transfer function, as are often required in analogue circuits, for example in circuits with switched capacitors.

In a so-called mixed signal section, i.e. in the section that operates with analogue signals, of the circuits, where generally fewer metal layers are required for the wiring in comparison with the digital circuit section, it is possible to use two metal layers, for example the last two metal layers, for producing highly linear capacitors (LIN-Caps). It is possible to produce capacitances per unit area of greater than $0.5 \text{ fF}/\mu m^2$. In the case of materials having a high dielectric constant, i.e. substantially greater than four, it is even possible to achieve surface densities of up to about $2.0 \text{ fF}/\mu m^2$. In this case, the layer thickness of the dielectric in the intermediate layer is essentially limited only by the etching selectivity. By way of example, in the case of an upper aluminium connection layer, by the aluminium/barrier etching rate in comparison with the dielectric etching rate. In the case of thinner aluminium/barrier stacks or highly selective aluminium/etching processes, the layer thickness of the dielectric may even be reduced below the typical 100 nm. By virtue of a screening below the capacitors, it is possible to utilize the underlying area for circuit functions with analogue signals.

The linear capacitors for the analogue signals can thus be produced at the same time as the production of the connection layers, without additional lithography steps. The area requirement for the linear capacitors is minimal in this case since analogue circuits can be realized below the capacitors. The last two metal layers need not necessarily be utilized for wiring in the circuit section that operates in analogue fashion, since the area requirement for the analogue circuit section is generally not determined by the wiring. The total of the capacitances of the linear capacitors lies between one and ten nanofarads, for example.

If the operating voltage lines and/or the terminals for the external connections and also the linear capacitors lie in the same connection layers, then this results in a particular refinement. This refinement is based on the insight that the structures in the lithography planes for carrying the operating voltage or the external terminals and for producing the planes previously used for the linear capacitances lie at different locations in the lateral direction. Therefore, it is possible to arrange these planes in one or two planes. As already mentioned above, the insulation layer is produced such that it is thinner and otherwise customary. Moreover, embedding the blocking capacitors in the metal planes for feeding the operating voltage affords a further advantage. The previously undesirable parasitic effect of the capacitive coupling of two adjacent metal planes lying one above the other is now utilized in order to produce a structure with linear capacitors. To date, a plurality of additional lithography masks have been necessary for producing the linear capacitors. In the circuit arrangement in accordance with the development, the capacitive coupling between the connection sections of the metal planes is not a disadvantage provided that the metal tracks are used for feeding the operating voltage. The capacitive coupling is even an advantage, because it serves for producing the capacitance of the blocking capacitors, which now need no longer be produced separately.

In a next development of the circuit arrangement, the two connection layers contain mutually overlapping electrically conductive regions which are connected to one another via elongated hole connections in the intermediate layer. Such elongated hole connections are used in particular when producing coils, i.e. inductances, which are intended to have a high quality factor Q. In one refinement, the connections which form the coils are arranged in spiral fashion. The quality factor of the coil is very high in particular because the elongated hole connection can be filled without the previously required tungsten connections even in the case of an upper connection layer made of aluminium or made of an aluminium alloy. On account of the comparatively thin intermediate layer, the elongated hole has a favourable aspect ratio, so that tungsten fillings can be dispensed with. The inductances of the coils are in the microhenry range, for example.

Low-impedance coils having a high quality factor Q are produced for example by connecting the topmost copper planes, which are arranged in an oxide or in FSG (Fluorited Silicate Glass), and optionally also those copper planes in a material having a small dielectric constant by means of elongated hole contacts. In addition, if appropriate, the topmost Al plane is also likewise incorporated concomitantly into the coil construction via elongated hole contacts or else over the whole area. The small thickness of the intermediate layer means that the aspect ratio of the contact holes becomes very small, for example about 0.2. The relatively high-impedance tungsten contacts, in comparison with the aluminium, for the filling of the contact holes is not necessary when using an Al connection layer. The quality factor Q of the coils thus increases.

If a plurality of the refinements specified above are combined, the result is a universally useable FBEOL concept (Far Back End Of Line) with a broad spectrum of application:

highly linear LIN capacitances (greater than 0.5 or 0.7 $\text{fF}/\mu m^2$), strongly coupled blocking capacitances, coils having a high quality factor Q, in particular RF coils, strongly coupled operating voltage feeds, terminal plates for external connections (wire bonding pads) or alternatively flip-chip terminal plates (pads), laser fuse connections (fuses), and signal lines in the last Cu plane and/or Al plane.

In this case, there is no need for additional process steps in addition to the previously customary process steps, with the result that no additional process costs are incurred either. The number of process steps can even be reduced in the production of MIM capacitors or blocking capacitors, due to the utilization of the previously undesirable parasitic effect.

Thus, by way of example, the previously customary oxide layer above the SiN barrier layer is no longer necessary. Instead of this, by way of example, the SiN layer is applied with greater thickness than heretofore or is alternatively replaced by a layer stack which will be explained in more detail below. The layer thickness of the intermediate layer is determined at a lower limit essentially by the ensuring of the breakdown strength and by the prevention of electromigration. At an upper limit, the layer thickness is limited in particular by the size of the required capacitance of greater than 0.5 fF/µm².

In a next development, the material of the intermediate layer has a relative permittivity of greater than four or greater than six. Thus, the dielectric constant of silicon nitride lies between 7 and 8. Materials having dielectric constants of between 4 and 30 can be included in a simple manner in a process for producing an integrated circuit.

In another development, the two connection layers have a distance of less than 200 nm, in particular less than 100 nm, between one another. However, the distance between the connection layers should be greater than 50 nm in order to ensure low failure rates.

In another development, the connection layer lying nearer to the components contains copper as main constituent. The main constituent is a constituent which has a proportion of at least 80 percent of the total number of atoms in the substance. Copper is distinguished by its higher conductivity, in particular, in comparison with aluminium. In one refinement, the upper connection layer is a layer containing aluminium as main constituent. It is thus possible, particularly if this layer is the topmost connection layer, to use known production technologies, in particular for producing external connections. Moreover, contact holes between the connection layers can be filled with aluminium on account of the small thickness of the intermediate layer. The filling of the contact holes and the deposition of the aluminium for the upper connection layer can be carried out in one method step, i.e. without changing the process conditions. In an alternative refinement, the upper connection layer, in particular the topmost connection layer, is a layer containing copper as main constituent. For such layers, too, there are connection techniques which have already attained production maturity or will attain this in the foreseeable future. If both connection layers are made of copper, then this results, for example, in a high conductivity of the connections. In one refinement, the lower connection layer is likewise composed of aluminium or an aluminium compound.

In another development, the insulation layer contains at least one of the constituents nitride, preferably silicon nitride or aluminium nitride, tantalum pentoxide, hafnium oxide or aluminium oxide. The materials mentioned have a high dielectric constant, i.e. greater than four, and can be employed comparatively simply in a process for producing an integrated circuit.

In another development, the insulation layer contains at least two layers which have been produced under different process conditions, preferably using an HDP method (High Density Plasma) and a PECVD method (Plasma Enhanced Chemical Vapour Deposition). By virtue of this measure, it is possible firstly to produce a partial layer which, on account of its density, has the best possible properties for preventing electromigration. Afterwards, it is possible to produce a partial layer which has a particularly high dielectric constant.

In one refinement, the insulation layer essentially comprises a silicon nitride layer, preferably less than 20 nm, which has been deposited by an HDP method, and a dielectric layer which has been deposited by a PECVD method, preferably having a thickness of greater than 30 nm, and preferably of about 80 nm.

The dielectric layer contains one of the abovementioned materials having a large dielectric constant. The dielectric layer is preferably a multilayer stack which has been produced by an interruption of the deposition and subsequent continuation of the deposition with the same process conditions. The individual layers of the multilayer stack contain the same material.

In another refinement, the insulation layer is a homogeneous layer which principally contains silicon nitride. This material can be processed without difficulty in integrated circuit technology. The silicon nitride layer preferably has a thickness of greater than 50 nm, and preferably of about 100 nm, but 200 nm should not be exceeded.

In another development, an auxiliary layer is arranged between the connection layer produced first and the insulation layer, which auxiliary layer contains, as main constituent, preferably a copper compound comprising copper and at least one of the elements cobalt, tungsten, phosphorus or boron. However, the auxiliary layer can also be produced from a material with comparable properties with regard to the prevention of electromigration and/or the reaction of copper and constituents of the insulation layer. The auxiliary layer suppresses the formation of hillocks during later heat-treatment processes.

A suitable choice of the deposition and heat-treatment conditions of the lower connection layer made of copper also makes it possible to ensure that hillocks on the lower connection layer can be avoided or removed before the application of the insulation layer.

In particular, a combination of the measures mentioned makes it possible to produce circuit arrangements with failure rates of less than 100 fit, less than 10 fit or even less than 1 fit.

In a next development, the circuit arrangement contains a plurality of connection layers, for example 6 or 8 connections layers. In this development, the connection layers with the high capacitance per unit area are the connection layers the furthest away from the substrate. By virtue of this measure, it is necessary, for example, to implement only a low outlay for a screening.

The invention additionally relates to methods for producing a circuit arrangement, in particular the circuit arrangement according to the invention or one of its developments. In one method according to the invention, firstly a first connection layer is produced. Afterwards, an intermediate layer is deposited. A further connection layer is subsequently deposited. The intermediate layer is designed in such a way that the capacitance per unit area between the two connection layers is greater than 0.5 fF/µm².

In one development of the method according to the invention, the intermediate layer is applied to a planar connection layer that has already been deposited. Only afterwards is the production of the upper connection layer begun.

In another development of the method according to the invention, firstly one connection layer is applied. Afterwards, the cut-outs for connection sections of the upper connection layer are applied. Only then is the intermediate layer applied. In this development, the upper connection layer contains copper, for example.

The deposition of the intermediate layer e.g. on copper or a copper alloy is also protected.

The technical effects mentioned above likewise apply to the methods according to the invention and to their developments.

Exemplary embodiments of the invention are explained below with reference to the accompanying drawings, in which.

Figure 1:
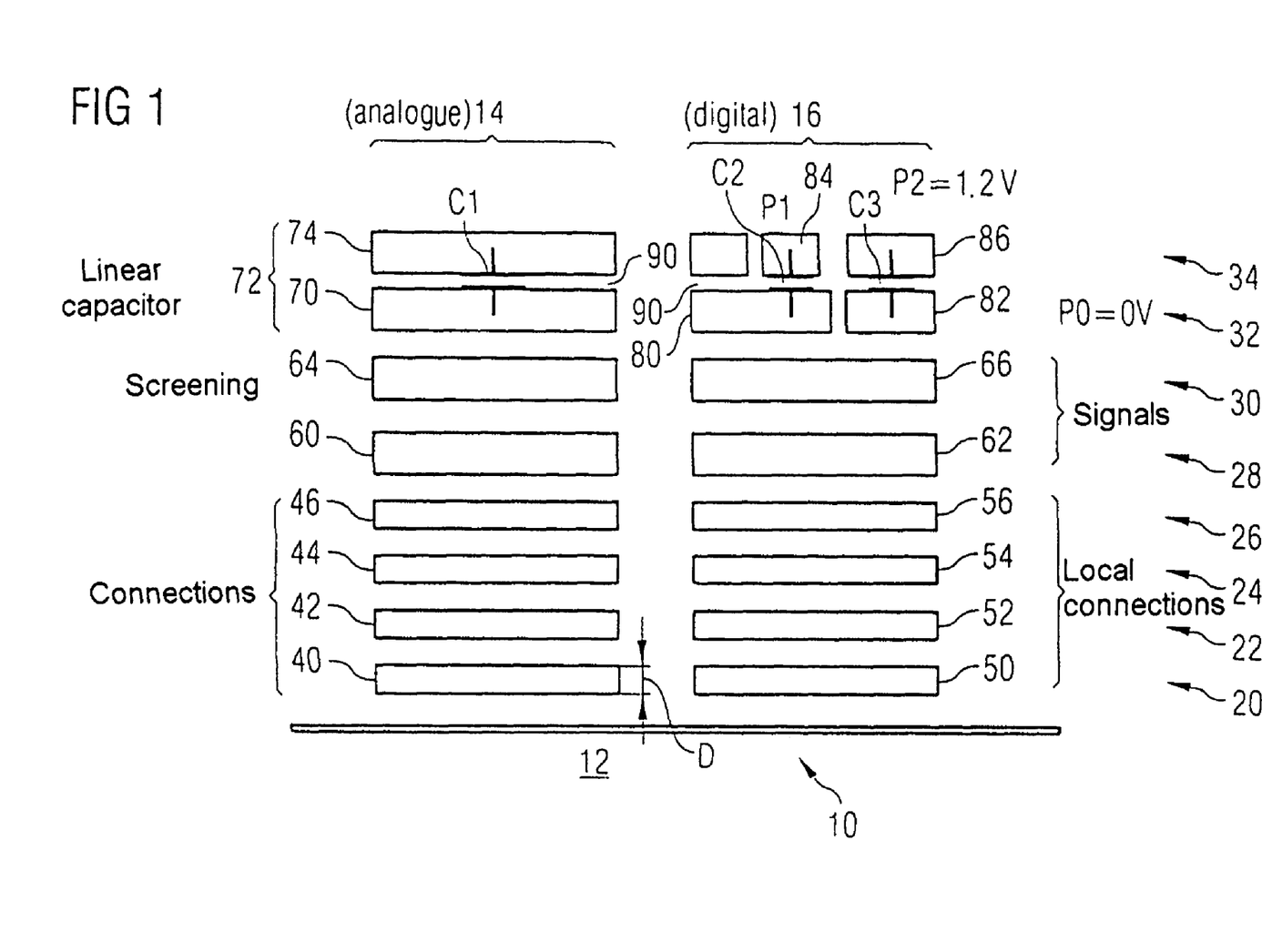
FIG. 1 shows the utilization of metal layers in an integrated circuit arrangement.

FIG. 1 shows the utilization of metal layers of an integrated circuit arrangement 10. The circuit arrangement 10 contains, in a silicon substrate 12, a multiplicity of integrated semiconductor components, the latter not being illustrated in FIG. 1, however. The components arranged in the substrate form two spatially separate regions, namely an analogue section 14 and a digital section 16. In the analogue section 14, principally analogue signals are processed, i.e. signals which have a continuous range of values. In the digital section 16, by contrast, principally digital signals are processed, i.e. signals which have, by way of example, only two values assigned to two switching states.

Above the silicon substrate 12, the circuit arrangement 10 additionally contains 8 metal layers 20 to 34, between which there are arranged, rather than further metal layers, insulating layers which have e.g. a thickness of 500 nm between the metal layers 20 to 32. The metal layers 20 to 34 are each arranged in a plane. The planes of the metal layers 20 to 34 are arranged parallel to one another and also parallel to the main area of the silicon substrate 12. The metal layers 20 to 34 each extend both in the analogue section 14 and in the digital section 16.

In the analogue part 14, the bottommost four metal layers 20, 22, 24 and 26 contain, in the order mentioned, connection sections 40, 42, 44 and 46, respectively, which form connections between the components of the analogue part 14. In the digital part 16, the metal layers 20, 22, 24 and 26 contain, in this order, connection sections 50, 52, 54 and 56, respectively, which form local connections between the components of the digital section 16. The connection sections 40 to 56 have a thickness D of 100 nm, for example, perpendicular to the substrate 12.

In the analogue section 14, the metal layer 28 contains connection sections 60 which carry analogue signals and connect the components of the analogue section 14. In the digital section 16, the metal layer 28 contains connection sections 62 which connect the components of the digital section 16 and thus carry digital signals. In the analogue section 14, the metal layer 30 contains a connection section 64 which covers the analogue section 14 over the whole area and serves for screening the analogue section from overlying components. In the digital section 16, the metal layer 30 contains connection sections 66 which carry digital signals because they are connected to the components of the digital section 16. The connection sections 60 to 66 have twice the thickness D.

The metal layers 32 and 34 form the two topmost metal layers. In the analogue section 14, the metal layer 32 contains an electrode 70, a capacitor 72 with a linear transfer function and a capacitance C1. The other electrode 74 of the capacitor 72 lies in the metal layer 34 above the electrode 70.

In the digital section 16, the metal layer 32 contains two connection sections 80 and 82 which carry an earth potential P0 of 0 volts.

Located above the connection section 80 is a connection section 84 which carries an operating potential P1 of 2.5 volts, for example. A capacitance C2 associated with a blocking capacitor is formed between the connection sections 80 and 84.

Situated above the connection section 82 in the metal layer 34 is a connection section 86 which carries a second operating potential P2, for example 1.5 volts. A capacitance C3 associated with a further blocking capacitor is formed between the connection section 82 and the connection section 86. The size of the capacitances C1, C2 and C3 is determined, on the one hand, by the size of the overlapping connection sections 70 to 86. On the other hand, the capacitance per unit area between the connection sections 70 and 74, and 80 and 84, and 82 and 86, is determined by the formation of an intermediate layer 90 lying between the metal layers 32 and 34. The intermediate layer 90 is designed in such a way that a capacitance per unit area of greater than 0.5 $fF/\mu m^2$ is produced. Exemplary embodiments for the formation of the intermediate layer 90 are explained in more detail below with reference to FIGS. 2 to 4.

The connection sections 70 to 86 have four times the thickness D and are thus suitable in particular for conducting high currents, as occur in connection sections 80 to 86 for feeding the operating voltage.

Figure 2:
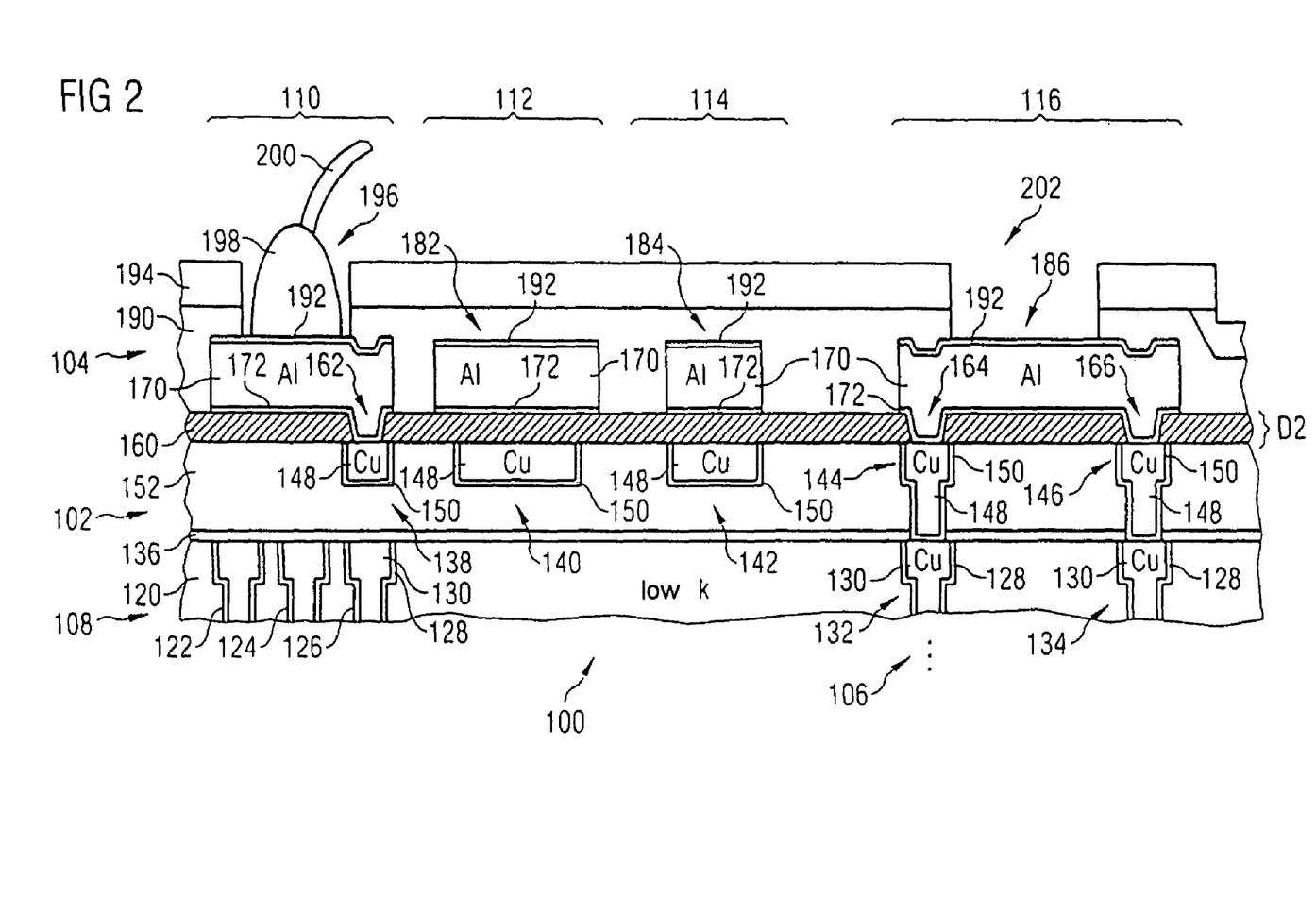
FIG. 2 shows an integrated circuit arrangement with a penultimate metal layer made of copper and a last metal layer made of aluminium.

FIG. 2 shows a circuit arrangement 100 with a penultimate metal layer 102 and a last metal layer 104. Metal layers 106 arranged below the penultimate metal layer 108 and a substrate of the circuit arrangement 100 are indicated by dots.

In FIG. 2, a bonding connection 110, a linear capacitor 112, a blocking capacitor 114 arranged between operating voltage lines, and a so-called fuse connection 116 are illustrated as examples of components which can be arranged in the two topmost metal layers 102 and 104.

The metal layer 108 contains, as insulating material, a material having a low dielectric constant k (Blok—barrier low k), for example SILK (silicon low k), i.e. porous silicon dioxide. In the region of the bonding connection 110, the metal layer 108 contains a multiplicity of contact holes 122 to 126 (sea of vias). The contact holes 122, 124 and 126 are filled with a liner/barrier layer 128 and with copper 130. The barrier layer comprises titanium nitride, for example. Below the fuse connection 116, the metal layer 108 contains connection sections 132 and 134, which lead to components which are connected via the fuse connection 116.

Located between the metal layer 108 and the metal layer 102 is a barrier layer 136 made of silicon nitride having a thickness of less than 20 nm, for example having a thickness of 15 nm. As an alternative, a BLOK material (Barrier low k) is also used, e.g. silicon carbide.

In the region of the bonding connection 110, the metal layer 102 contains a line 138, which leads to the bonding connection. In the region of the capacitor 112, the metal layer 102 contains a bottom electrode 140 of the capacitor 112. In the region of the blocking capacitor 114, the metal layer 102 contains a lower operating voltage line 142. In the region of the fuse connection 116, the metal layer 102 contains two connection sections 144 and 146, which lead to the fuse connection 116.

The line 138, the bottom electrode 140, the lower operating voltage line 142 and the connection sections 144, 146 are formed by copper 148, which is isolated by a liner/barrier layer 150 from the silicon dioxide 152 contained in the metal layer 102 for insulating the individual connections. The liner/barrier layer 150 comprises e.g. titanium nitride.

Situated between the metal layer 102 and the metal layer 104 is an intermediate layer 160, whose thickness D2 is about 100 nm. The intermediate layer 160 is composed completely of silicon nitride, for example.

In the region of the bonding connection 110, a contact hole 162 penetrates through the intermediate layer 160, the said contact hole also being referred to as a via because it lies between two metal layers. In the region of the fuse connection 116, two contact holes or vias 164 and 166 penetrate through the intermediate layer 160. The contact holes or vias 162, 164 and 166 are filled with aluminium 170. A liner/barrier layer 172, for example made of titanium nitride, isolates the aluminium 170 from the intermediate layer 160 and the copper and thus prevents diffusion processes. The liner/barrier layer 172 also prevents or reduces electron migration. Except for the perforations for the contact holes 162 to 166 and for further contact holes (not illustrated), the intermediate layer 160 is formed over the whole area in the region between the metal layers 102 and 104.

In the region of the bonding connection 110, the metal layer 104 contains a terminal plate 180 made of aluminium 170. In the region of the capacitor 112, the metal layer 104 contains a top electrode 182 of the capacitor 112 made of aluminium 170. In the region of the blocking capacitor 114, the metal layer 104 contains an upper operating voltage line 184 made of aluminium 170. In the region of the fuse connection 116, the metal layer 104 contains a fuse section 186 made of aluminium 170. The fuse section 186 bridges the contact holes 164 and 166. The metal layer 104 contains silicon dioxide 190 for the purpose of insulation between the terminal plate 180, the top electrode 182, the upper operating voltage line 184 and the fuse section 186. Residues of an antireflection layer 192 are situated on the upper areas of the terminal plate 180, the top electrode 182, the upper operating voltage line 184 and the fuse section 186. The metal layer 104 is covered by a passivation layer 194 comprising silicon nitride, for example.

In the region of the bonding connection 110, a cut-out 196 is situated in the passivation layer 194 and in the silicon dioxide 190. The cut-out 196 ends on the terminal plate 180. The terminal head 198 of a bonding wire 200 is situated in the cut-out 196.

A further cut-out 202 is situated in the region of the fuse connection 116. The cut-out 202 penetrates through the passivation layer 194 and the silicon dioxide 190. The cut-out 202 ends in a central region of the fuse section 186. Through the cut-out 202, the fuse section 186 can be melted with the aid of a laser beam and thus interrupted.

The following method steps are carried out in order to produce the circuit arrangement 100:

Production of the lower metal layers 106, 108 and 102 made of copper:

The lower metal layers 106, 108 and 102 are produced by copper deposition or by deposition of a copper alloy in a material having a low dielectric constant k, the damascene technique being used, for example. In addition, a multiplicity of contact holes 122 to 126 are arranged below the bonding connection 110 for the purpose of mechanical stabilization.

The silicon dioxide 152 or a different material, e.g. FSG (Fluoride Silicate Glass), is applied and patterned with the aid of a lithography process. The liner/barrier layer 150 and the copper 148 are subsequently deposited.

The liner/barrier layer 150 and the copper 148 are then removed approximately down to the level of the silicon dioxide 152 with the aid of a chemical mechanical polishing method (CMP). The surface is subsequently cleaned, for example with the aid of brush-assisted cleaning (brush clean).

Variants for the production of the intermediate layer 160:

a) Approximately 100 nm of silicon nitride are deposited as dielectric diffusion barrier and as intermetal dielectric with respect to the topmost metal layer 104, for example with the aid of a CVD method (Chemical Vapor Deposition) or with the aid of a PECVD method (Plasma Enhanced CVD).

b) Firstly a layer of less than 20 nm of silicon nitride is deposited by means of an HDP method (High Density Plasma). On account of the additional ion bombardment during this method, this silicon nitride layer is solidified and thus affords optimum reliability against electromigration of the copper 148. Afterwards, about 80 nm of silicon nitride are deposited with the aid of a PECVD method, the deposition preferably being interrupted a number of times in order to produce a multilayer stack which affords an optimum dielectric breakdown strength.

c) Firstly a silicon nitride layer having a thickness of less than 20 nm is deposited on the cleaned metal layer 102 using an HDP method. This layer affords optimum reliability against electromigration. This is followed by the deposition of about 80 nm of a dielectric with a high dielectric constant k in order to achieve a maximum capacitance per unit area. Suitable materials are, inter alia, $Al_2O_3$ or $Ta_2O_5$.

d) Approximately 80 nm of aluminium oxide ($Al_2O_3$) are deposited as intermetal dielectric with respect to the topmost metal layer 104.

e) A layer stack comprising approximately 15 nm of $Al_2O_3$, approximately 30 nm of $Ta_2O_5$ and approximately 15 nm of $Al_2O_3$ is deposited.

Contact hole production (Via):

A photoresist is applied to the intermediate layer 160 and exposed and developed in accordance with the structures for the contact holes 162, 164 and 166.

The contact holes 162, 164 and 166 are etched into the intermediate layer 160.

The residues of the photoresist layer are removed.

The contact holes 162, 164 and 166 are cleaned, for example in a wet cleaning step, in order to remove copper oxide that has possibly deposited on the bottom of the contact holes 162, 164 and 166.

Production of the metal layer 104:

The barrier layer 172 is deposited, a sputtering precleaning or a reactive precleaning, e.g. based on H2, being carried out. Suitable materials for the metallic diffusion barrier are Ta, TaN, Ti, TiN, W, WN, etc. Suitable deposition methods are the PVD method (Physical Vapor Deposition) or the CVD method.

The aluminium 170 or an aluminium alloy is deposited with the aid of a PVD method or with the aid of a CVD method.

The antireflection layer 192 is deposited, for example a titanium nitride layer, which is deposited with the aid of a PVD method.

A lithography method for patterning the aluminium 170 is carried out, the position of the terminal plate 180, of the top electrode 182, of the upper terminal line 184 and thus of the upper plate of the blocking capacitor 114, and also of the fuse section 186 being defined. The position of coils or of connections for carrying signals may additionally be defined.

The aluminium 170 is etched, with a stop at the upper area of the intermediate layer 160.

The photoresist is removed and a cleaning step is carried out.

Concluding passivation:

The silicon dioxide 190 or another suitable material, e.g. FSG, is deposited. The nitride layer 194 is subsequently deposited.

A lithography method is carried out for defining the position of the cut-outs 196 and 202, i.e. the openings leading to the terminal plate 180 and to the fuse section 186, respectively.

The cut-outs 196 and 202 are etched.

The photoresist is removed and a cleaning step is carried out.

Optionally, the cut-outs 196 and 202 can also be opened using a photosensitive polyimide as mask. The method explained with reference to FIG. 2 can also be carried out when, instead of the copper, a copper alloy, aluminium or an aluminium alloy is used in the metal layer 102 or else in all the lower metal layers. The variants for producing the intermediate layer 160 and the method steps for producing the overlying structure, in particular, remain unchanged in this case.

Instead of the aluminium in the metal layer 104, it is also possible to use copper or a copper alloy. If it is desired to avoid the disadvantages which arise when etching the copper, then the copper is patterned by means of a dual damascene technique, see FIG. 3.

Figure 3:
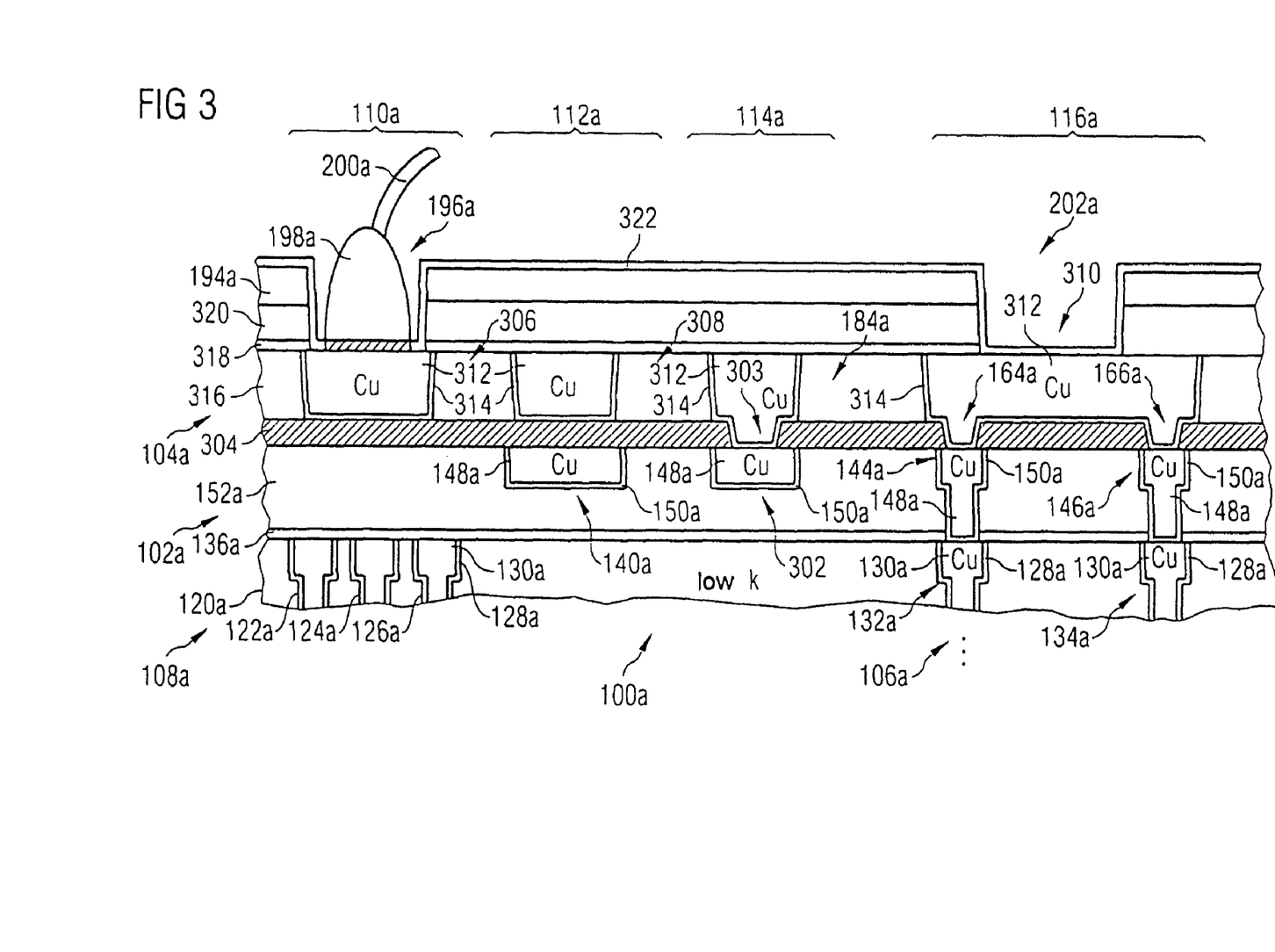
FIG. 3 shows an integrated circuit arrangement with metal layers made of copper, firstly contact holes (vias) and then trenches for connection sections being produced in the topmost metal layer.

FIG. 3 shows a circuit arrangement 100a with a penultimate metal layer 102a and a last metal layer 104a, both of which contain copper or a copper alloy. In the case of the circuit arrangement 100a, in the topmost metal layer 104a, firstly contact holes 164a and 166a were produced and then trenches for connection sections of the metal layer 104a were produced. In FIG. 3, elements with the same structure and function as elements which have been explained with reference to FIG. 2 are designated by the same reference symbols, but the reference symbol is followed by the lower case letter a for the purpose of differentiation. These elements will not be explained again because the explanations given above are applicable.

The following differences emerge between FIGS. 2 and 3. FIG. 3 illustrates a different section through the circuit arrangement from FIG. 2. Therefore, by way of example, the line below the bonding connection 110a and also the contact hole or via associated with the bonding connection 110a are absent. Instead of the blocking capacitor 114, FIG. 3 shows a contact connection 300 with the aid of which a line 184a corresponding to the line 184 is connected to an operating voltage line 302 in the metal layer 102a. The contact connection 300 lies in a contact hole or via 303.

Lying between the metal layers 104a and 102a is an intermediate layer 304, which, for example, is composed entirely of silicon nitride. Variants for producing the intermediate layer 304 are explained further below.

In the metal layer 104a, a terminal plate 306 is situated in the region of the bonding connection 110a, a top electrode 308 is situated in the region of the linear capacitor 112a, the operating voltage line 184a is situated in the region of the contact connection 300 and a fuse section 310 is situated in the region of the fuse connection 116a. The terminal plate 306, the top electrode 308, the operating voltage line 184a and the fuse section 310 are composed of copper 312, which is isolated by a barrier layer 314, e.g. made of titanium nitride, from a silicon dioxide 316 contained in the metal layer 104a. A copper alloy may also be used instead of the copper 312.

A barrier layer 318, composed of silicon nitride, for example, is situated on the metal layer 104a. Situated on the barrier layer 318 is an oxide layer 320, for example silicon dioxide, which is part of a passivation. The passivation is also provided by the passivation layer 194a, for example a silicon nitride layer, lying on the oxide layer 320.

A thin dielectric layer 222, having a thickness of less than 5 nm, for example, is situated on the passivation layer 194a and also in the cut-outs 196a and 202a. The dielectric layer 322 is composed of silicon nitride, for example.

The following method steps are carried out during the production of the circuit arrangement 100a:

Production of the lower metal layers 106a, 108a and 102a: reference is made to the explanations concerning FIG. 2.

Variants for producing the intermediate layer 304:

d, e) cf. variant d and e for producing the intermediate layer 160.

f) A silicone nitride layer having a thickness of greater than 50 nm is deposited as dielectric diffusion barrier and intermetal dielectric. The thickness of the dielectric is limited by the etching selectivity between oxide layer/FSG and silicon nitride. After the etching of the trench for the top electrode 308, an electrically reliable dielectric must also remain in the region of the capacitor 112a.

g) Firstly a silicon nitride layer having a thickness of less than 20 nm is deposited. In this case, an HDP method is used in order to achieve optimum reliability with respect to electromigration. Afterwards, a silicon nitride layer greater than 30 nm is deposited by means of a PECVD method, preferably as a multilayer stack for an optimum dielectric breakdown strength.

h) Firstly a silicon nitride layer having a thickness of less than 20 nm is deposited using an HDP method. A layer having a thickness of greater than 30 nm, comprising a dielectric with a high dielectric constant k, e.g. $Al_2O_3$ or $Ta_2O_5$, is subsequently deposited. This layer leads to a maximum capacitance per unit area of the linear capacitor 112a or of blocking capacitors in the circuit arrangement 100a. In this case, too, the total thickness of the intermediate layer 304 should be greater than 50 nm. The thickness of the intermediate layer 304 is downwardly limited by the etching selectivity between oxide layer/FSG and the layer with the high dielectric constant k.

Production of the metal layer 104a, contact hole production:

The silicon dioxide 316 or another suitable material, e.g. FSG, is deposited.

A lithography method is carried out for defining the position of the contact openings 303, 164a, 166a.

Contact holes are etched in the silicon dioxide 316 above the later position of the contact holes 303, 164a and 166a. The etching operation stops on the intermediate layer 304.

The photoresist is removed.

The contact holes are etched through the intermediate layer 304 until the copper 148a is uncovered.

Production of trenches in the metal layer 104a:

A lithography method is carried out in order to define the position of the trenches in which the copper 312 is to be introduced.

The trenches are etched, with a stop on the intermediate layer 304. The trenches for the terminal plate 306, for the top electrode 308, for the operating voltage line 184 and for the terminal section 310 are produced in this case. In addition, trenches for operating voltage lines with blocking capacitances, for signal lines or for coils can be produced at the same time.

The photoresist is removed.

The contact holes are cleaned, for example by means of a wet cleaning step (e.g. EKC 525), in order to remove copper oxide that has possibly been produced at the bottom of the contact holes.

Further production of the metal layer 104a:
The barrier layer 314 is deposited, in which case a sputtering precleaning or a reactive precleaning (e.g. based on H₂) should be carried out. The barrier deposition is carried out for example with the aid of a PVD method or with the aid of a CVD method. It is possible to use the same materials as for the barrier layer 172.

A copper layer with growth nuclei is subsequently deposited, e.g. by means of PVD methods or by means of CVD methods, or by means of an electroless method from a solution.

The copper 312 is introduced with the aid of a dual Damascene filling method, for example with the aid of an ECD method (Electrochemical Deposition).

The copper 312 and the barrier layer 314 are removed outside the trenches with the aid of a CMP method.

The barrier layer 318 is applied. The barrier layer 318 has a thickness of about 20 nm to about 30 nm. By way of example, silicon nitride is applied with the aid of a PECVD method or with the aid of an HDP method. However, it is also possible to use other materials, e.g. a barrier material with a low dielectric constant k (BloK—Barrier low k).

Production of the passivation:
The passivation is subsequently produced, for example by application of the silicon dioxide layer 320 and of the silicon nitride layer 194a.

A lithography method is carried out for defining the position of the cut-outs 196a and 202a.

The cut-outs 196a and 202a are etched, with a stop on the barrier layer 318.

The photoresist is removed.

The barrier layer 318 is etched through in the region of the cut-outs 196a and 202a.

The extremely thin but dense dielectric layer 322 is deposited, which has a thickness of less than 5 nm, for example. An ALCVD method (Atomic Layer CVD), for example, is used for the deposition. A suitable material is silicon nitride. The dielectric layer 322 protects the copper terminal plate 206 and the fuse section 310 against corrosion and oxidation. However, the dielectric layer 322 must be thin enough that bonding can nevertheless be effected on the Cu terminal plate 306.

Figure 4:
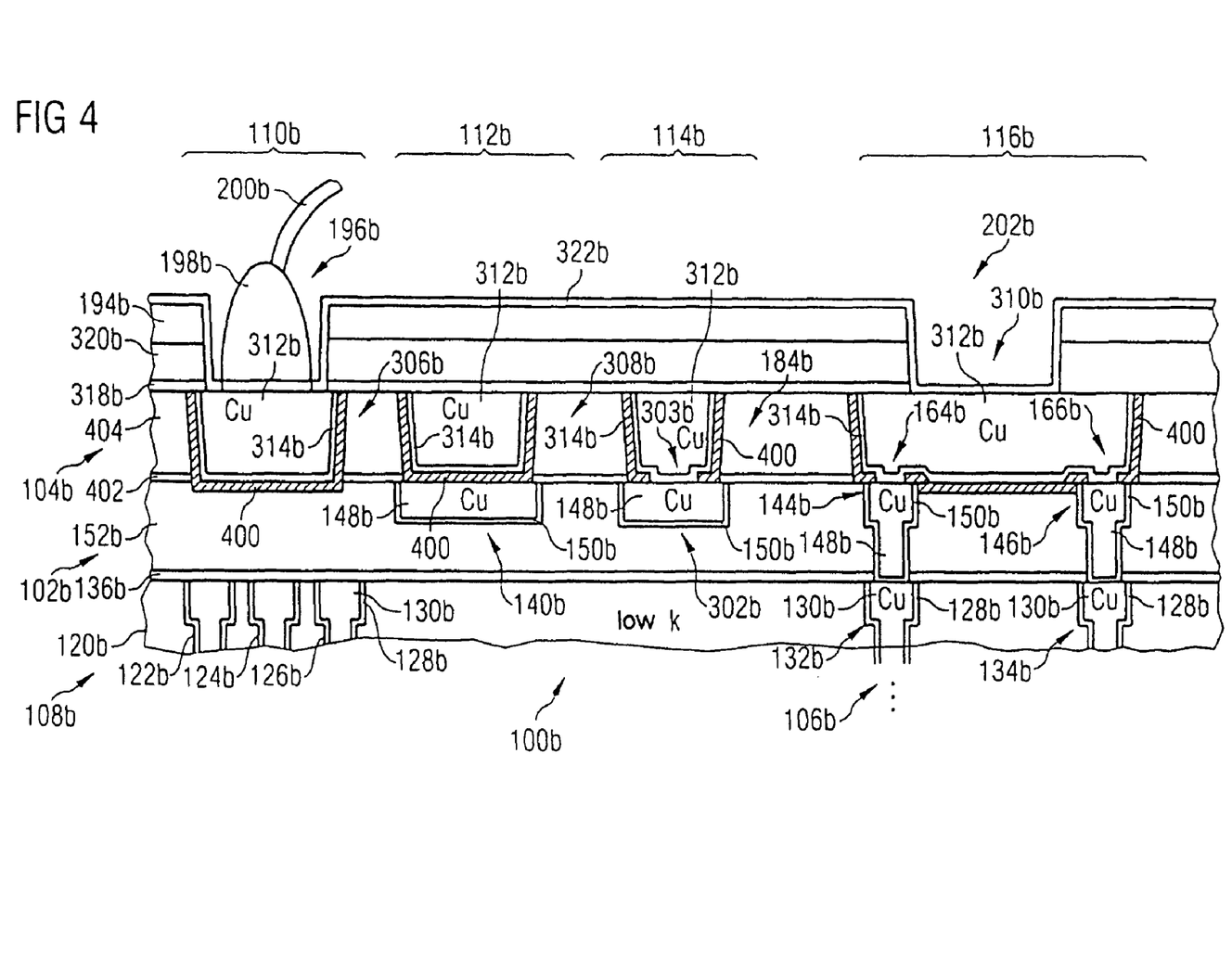
FIG. 4 shows a circuit arrangement with metal layers made of copper, firstly trenches for connection sections, then an intermediate layer and only afterwards contact holes (vias) being produced.

FIG. 4 shows a circuit arrangement 100b with a penultimate metal layer 102b and a last metal layer 104b, both of which contain copper or a copper alloy. In the case of the circuit arrangement 100b, firstly trenches for connection sections of the metal layer 104b were produced in the topmost metal layer 104b. Afterwards, an intermediate layer 400 may be deposited and contact holes 303b, 164b and 166b produced. Since the intermediate layer may be deposited as one layer, the follow-on process that delineates and etches the intermediate layer into portions does not change the fact that the portions comprise one intermediate layer. The intermediate layer still provides isolation between the metal layer 102b and the components that are formed on or through the metal layer 104b as illustrated in FIG. 4. In FIG. 4, elements with the same structure and function as elements which have been explained with reference to FIGS. 2 and 3 are designated by the same reference symbols, but the reference symbols are followed by the lower case letter b for the purpose of differentiation. These elements will not be explained again because the explanations given above are applicable.

Differences emerge between FIG. 4 and FIG. 3, which differences will become clear in the explanation of the method steps for producing the circuit arrangement 100b:

Production of the lower metal layers 106b, 108b and 102b:
Reference is made to the explanations concerning FIG. 2.

Production of a barrier layer 402:
A barrier layer 402 having a thickness of greater than 20 nm is deposited on the levelled metal layer 102b for example with the aid of a PECVD method or with the aid of an HDP method. The barrier layer 402 comprises, for example, silicon nitride or a material with a low dielectric constant k (Blok), e.g. silicon carbide.

Production of the metal layer 104b, trench production:
An oxide layer, e.g. a silicon dioxide layer 404, is deposited on the barrier layer 402. As an alternative, it is also possible to use a different material, e.g. FSG.

A lithography method is carried out for defining the position for the trenches in which the copper 312b is subsequently to be introduced.

The trenches are etched, with a stop on the barrier layer 402.

The photoresist is removed in order to prevent an oxidation of the copper.

The barrier layer 402 is etched through in the region of the trenches. A degree of overetching must be effected in order to ensure a complete removal of the regions of the barrier layer 402 above the copper 148b. This leads to deeper trenches in regions in which, rather than copper 148b, silicon dioxide 152b is located, i.e. in the region below the bonding connection 110b and in the region below the fuse connection 116b.

Variants for the production of the intermediate layer 400:
d, e) cf. variant d and e, respectively, for the production of the intermediate layer 160.

f to h) cf. variant f to h for the production of the intermediate layer 304.

Production of contact holes (vias):
The position of the contact holes 303b, 164b, 166b and of further contact holes (not illustrated) is defined with the aid of a lithography method.

The contact holes are etched into the intermediate layer 400.

The photoresist is removed.

The contact holes are cleaned, for example by means of a wet cleaning step (EKC 525), in order to remove copper oxide that has possibly been produced at the bottom of the contact holes.

Further production of the metal layer 104b:
Reference is made to the explanations concerning FIG. 3 in connection with the further production of the metal layer 104a. There is a difference merely in the fact that, in addition to the copper 312b and the barrier layer 314b, the intermediate layer 400 is also removed outside the trenches when carrying out the CMP method.

In addition to the already mentioned advantage of the invention, of the developments and of the exemplary embodiments, attention shall be drawn to the following aspects:

The topmost aluminium plane can be utilized for comparatively thick and wide operating voltage lines. Producing a wiring plane from aluminium without tungsten fillings in the contact holes (vias) is more cost-effective than producing a copper plane by means of a CMP method. Since it is not necessary to planarize the last metal plane, a copper plane is not necessary.

Already existing installations can be used for the patterning of the last aluminium plane because the requirements made of the lithography are comparatively relaxed.

It is possible to carry signals in the last two metal layers as well, e.g. low-impedance feed lines (line outs) or particularly sensitive mixed-signal signal lines. If signal lines are arranged in the two capacitively strongly coupled metal layers, then care must be taken to ensure that signal layers do not cross one another. As an alternative, however, it is also possible to wire the signal lines in the two planes in parallel and thus to enable particularly low-impedance signal lines. The additional outlay for this is low because it is necessary merely to provide an additional layout plane, which can be achieved by software technology.

Stronger capacitive couplings between signal lines in one of the two planes can be avoided by slightly widening the minimum distances between signal lines in the last metal layer or in the penultimate metal layer, e.g. by 10 to 20%.

In all the exemplary embodiments, the circuit arrangement contains at least one contact hole which only penetrates through the intermediate layer which defines a capacitance per unit area of greater than 0.5 fF/$\mu m^2$ or greater than 0.7 fF/$\mu m^2$ or about 2 fF/$\mu m^2$ between the connection layers. In other words, the contact hole does not penetrate through any further layers apart from the intermediate layer which defines the said capacitance per unit area.

LIST OF REFERENCE SYMBOLS

10 Circuit arrangement
12 Silicon substrate
14 Analogue section
16 Digital section
20 to 34 Metal layer
40 to 66 Connection section
D Thickness
70 Electrode
72 Capacitor
74 Electrode
80 Connection section
P0 Earth potential
P1, P2 Operating potential
C1 to C3 Capacitance
90 Intermediate layer
100 Circuit arrangement
102 Penultimate metal layer
104 Last metal layer
106, 108 Further metal layer
110 Bonding connection
112 Linear capacitor
114 Blocking capacitor
116 Fuse connection
120 Silicon carbide
122 to 126 Contact hole
128 Liner/barrier layer
130 Copper
132, 134 Connection section
136 Barrier layer
138 Line
140 Bottom electrode
142 Lower operating voltage line
144, 146 Connection section
148 Copper
150 Liner/barrier layer
152 Silicon dioxide
160 Intermediate layer
D2 Thickness
162 to 166 Contact hole (via)
170 Aluminium
172 Liner/barrier layer
180 Terminal plate
182 Top electrode
184 Upper operating voltage line
186 Fuse section
190 Silicon dioxide
192 Anti-reflection layer
194 Passivation layer
196 Cut-out
198 Terminal head
200 Bonding wire
202 Cut-out
k Dielectric constant
300 Contact connection
302 Operating voltage line
303 Contact hole (via)
304 Intermediate layer
306 Terminal plate
308 Top electrode
310 Fuse section
312 Copper
314 Liner/barrier layer
316 Silicon dioxide
318 Barrier layer
320 Silicon dioxide layer
322 Dielectric layer
400 Intermediate layer
402 Barrier layer
404 Silicon dioxide layer

The invention claimed is:

1. An integrated circuit arrangement having components arranged in a semiconductor substrate comprising:
    two connection layers, each layer having at least one electrically conductive connection to a component; and
    an intermediate layer formed from at least one dielectric material, the intermediate layer formed between the connection layers and the intermediate layer defines the capacitance per unit area, where
    the intermediate layer provides a capacitance per unit area between the connection layers greater than 0.5 fF/$\mu m^2$ and the intermediate layer comprises a material having a dielectric constant greater than 4, the distance between the connection layers being less than about 200 nm, and the intermediate layer has at least one contact hole which only penetrates through the intermediate layer and is disposed between the two connection layers where the contact hole adjoins one of:
    a terminal plate of a terminal for connecting an external electrically conductive connection,
    a fuse section for a fuse connection, and
    two spiral conductive regions of a coil that are arranged in the two connection layers.

2. The circuit arrangement of claim 1, further comprising a passivation layer disposed on the second connection layer for protecting against outside ambient influences, where the passivation layer has at least one cut-out that accesses a connection section in the connection layer and the connection section forms the terminal.

3. The circuit arrangement of claim 1, further comprising a passivation layer for protection against outside ambient influences, where the passivation layer has at least one cut-out that accesses a connection section in the connection layer and the connection section has a fuse connection for a fusible link for selecting circuit variants.

4. The circuit arrangement of claim 1, where at least one connection section in one connection layer and at least one connection section in the other connection layer provides the operating voltage and the connection sections directly overlap opposite to one another to form a capacitor.

5. The circuit arrangement of claim 4, where the capacitor suppresses interference pulses during an operation of the circuit arrangement.

6. The circuit arrangement of claim 1, further comprising electrodes contained in the connection layers for at least one capacitor and that a part of the intermediate layer in the region of the capacitor forms a dielectric for the capacitor.

7. The circuit arrangement of claim 6, where the capacitor is in a circuit arrangement that operates with analog signals.

8. The circuit arrangement of claim 6, where the capacitor is in a circuit arrangement that operates with digital signals.

9. The circuit arrangement of claim 1, further comprising mutually overlapping electrically conductive regions communicating between the two connection layers through the intermediate layer positioned approximately perpendicular to the plane of the connection layers, the conduction regions having a spiral and forming inductances.

10. The circuit arrangement of claim 1, where the capacitance per unit area is greater than 0.7 f/μm$^2$.

11. The circuit arrangement of claim 1, where the material about completely fills the space between a mutually opposite conductive region between the two connection layers.

12. The circuit arrangement of claim 1, where the connection layers are separated by a distance of less than about 150 nm.

13. The circuit arrangement of claim 1, where the connections layers are separated by a distance of about 100 nm.

14. The circuit arrangement of claim 1, where the connection layers are formed of the same material.

15. The circuit arrangement of claim 14, where the material comprises one of aluminum and copper.

16. The circuit arrangement of claim 14, where a last applied connection layer of the two connection layers comprises one of aluminum and an aluminum alloy as a main constituent and the contact holes between the connection layers are likewise filled with one of the aluminum and the aluminum alloy, respectively.

17. The circuit arrangement of claim 1, where one connection layer contains a material as a main constituent which differs from the material forming the main constituent of the other connection layer.

18. The circuit arrangement of claim 17, where the material is comprised by one of aluminum, an aluminum alloy, copper and a copper alloy.

19. The circuit arrangement of claim 17, where a last applied connection layer of the two connection layers comprises one of the aluminum and the aluminum alloy as a main constituent and the contact holes between the connection layers are likewise filled with one of the aluminum and the aluminum alloy, respectively.

20. The circuit arrangement of claim 1, where the intermediate layer further comprises a nitride and an oxide.

21. The circuit arrangement of claim 20, where the nitride further comprises one of silicon nitride and aluminum nitride.

22. The circuit arrangement of claim 20, where the oxide further comprises one of tantalum oxide, hafnium oxide and aluminum oxide.

23. The circuit arrangement of claim 1, where the intermediate layer further comprises at least two layers formed under a different process.

24. The circuit arrangement of claim 23, where the layer produced in a first process contains the same material as the layer produced in a second process.

25. The circuit arrangement of claim 23, where the layer produced in a first process comprises a different material as the layer produced in a second process.

26. The circuit arrangement of claim 25, where the different material in the second layer comprises a multi-stack produced by a plurality of interruptions of a deposition of the material in the first layer.

27. The circuit arrangement of claim 23, where one process is a High Density Plasma process and the other process is a Plasma Enhanced Chemical Vapor Deposition process.

28. The circuit arrangement of claim 1, further comprising an auxiliary layer between a first produced connection line comprising copper and the intermediate layer where the auxiliary layer further comprises copper and at least one of cobalt, tungsten, boron and phosphorus.

29. The circuit arrangement of claim 1, further comprising a plurality of connection layers and the plurality of connection layers with the higher capacitance per unit area are the connection layers arranged furthest from the substrate.

30. A method for producing an integrated circuit arrangement that has electronic components on a semiconductor substrate comprising:
   disposing on the substrate a first connection layer that includes at least one electrically conductive connection section that is part of an electrical conduction section operatively connecting to a component;
   disposing an intermediate layer comprising at least one dielectric material on the first connection layer;
   and disposing a second connection layer on the intermediate layer that includes at least one electrically conductive connection section that is part of an electrical conduction connection operatively connecting to a component, where the intermediate layer situated between the connection layers has a capacitance per unit area greater than 0.5 fF/μm$^2$ and comprises at least one material having a dielectric constant greater than 4 and the connection layers are separated by less than approximately 200 nm and one contact hole is formed that only penetrates through the intermediate layer and is disposed between the first and second connection layers where the contact hole is arranged in one of a region of a terminal for connecting an external electrically conductive connection, a region of a fuse connection, two conductive regions that form inductances that are connected by the contact hole, and a contact connection for an operating voltage.

31. The method of claim 30, further comprising disposing the intermediate layer on the first connection layer before disposing the second connection layer.

32. The method of claim 30, further comprising forming a cut-out in the connection section of the second connection layer.

33. The method of claim 32, further comprising disposing the intermediate layer in the cut-out for the connection section.

34. The method of claim 30, further comprising a metal layer disposed on the first connection layer where the connection layer is formed from a carrier material.

35. The method of claim 34, where the metal layer further comprises copper.

36. The method of claim 34, further comprising disposing an auxiliary layer on the metal layer.

37. The method of claim 36, where the auxiliary layer further comprises copper and at least one of cobalt, tungsten, phosphorus and boron.

38. The method of claim 36, further comprising disposing the intermediate layer on the auxiliary layer.

39. The method of claim 30, further comprising the intermediate layer having at least two layers.

40. The method of claim 39, further comprising a first layer deposited using a HDP method and a layer produced later is deposited using a PECVD method.

41. The method of claim 39, where a first layer and a layer produced later comprise the same material.

42. The method of claim 39, where a first layer and a layer produced later contain different materials.

43. The method of claim 39, where at least one layer is produced by a plurality of interruptions in the depositing of material and the follow-on depositing of material is continued with the same material and the same growth conditions as a previous layer.

* * * * *